United States Patent [19]

Lord

[11] Patent Number: 4,538,419

[45] Date of Patent: Sep. 3, 1985

[54] REFRIGERATION UNIT CONTROLS

[75] Inventor: Richard G. Lord, Liverpool, N.Y.

[73] Assignee: Carrier Corporation, Syracuse, N.Y.

[21] Appl. No.: 597,330

[22] Filed: Apr. 6, 1984

[51] Int. Cl.³ ............................................. G01K 13/00
[52] U.S. Cl. .................................... 62/129; 165/11 R; 236/94
[58] Field of Search ......................... 62/125, 127, 129; 236/94; 165/11

[56] References Cited

U.S. PATENT DOCUMENTS 4,146,085  3/1979  Wills ........................................ 62/127
4,411,139 10/1983  Bos ...................................... 62/127 X Primary Examiner—William E. Wayner
Attorney, Agent, or Firm—Douglas L. Miller

[57] ABSTRACT

A field test circuit for an electronic control of a refrigeration unit. The test circuit has a field installed test panel with a control switch and a readout device for indicating that portion of the electronic control to be tested. A microprocessor is provided with a logic program that provides coded information regarding the stage of capacity of the refrigeration unit, the operational status of the unit, diagnostic information of the unit, and a test procedure for testing all inputs and outputs of the microprocessor.

4 Claims, 3 Drawing Figures in the usual manner. Also, as shown in FIG. 1, the control system comprises a processor board 21, a display/set point board 22, a relay board 23, an accessory reset board 24, control transformer 25 and a plurality of thermistors.

The processor board 21 contains a microprocessor 36 and various other electronic components, such as, a power supply, A/D converters, expansion valve drivers, relay drivers, and display drivers. The microprocessor may be any device or combination of devices, suitable for receiving input signals, for processing the received input signals according to pre-programmed procedures, and for generating control signals in response to the processed input signals. The control signals generated by the microprocessor are supplied to control devices which control the operation of the refrigeration system in response to the control signals provided to the control devices from the microprocessor. Preferably, the microprocessor is a model 8031 manufactured by Intel Corporation, having an external eprom memory module. A masked version of the model 8031, i.e. a model 8751 is also suitable.

The processor board 21 is a generic control board for use with various refrigeration systems. To determine the configuration of the processor board 21 to be used with a specific refrigeration system, a configuration header 30 is used to correlate the processor board 21 to the specific physical characteristics of the refrigeration unit. The configuration header 30 contains a plurality of small wires 32, e.g. eight jumpers, that are selectively broken to develop a binary code which sets the configuration of the processor board 21. The configuration header 30 is generally preprogrammed at the factory and shall configure the processor board 21 for the type of unit to be controlled.

In FIG. 2 the processor board 21 is shown with its various inputs and outputs for controlling the refrigeration unit.

The processor board may also contain a plurality of small DIP switch assemblies 35 intended to be used in the field to select the field programmable options. The options may include unloaders, brine temperature, pull-down selection, and return water temperature reset. The DIP switches are generally ON-OFF switches connecting various set point controls to field thermistors or resistance temperature detectors. All field set-point adjustments, after the corresponding DIP switch is turned to the proper position are made through adjustable potentiometers. To be able to detect faulty potentiometers a valid potentiometer range of 10 to 95% of potentiometer travel has been established. If the potentiometer is outside the 10 to 95% range, then an alarm will be energized and the control will automatically transfer to its failsafe condition.

Further, as shown in FIG. 2, the processor board 21 is electrically connected through electrical connectors to various inputs and outputs. Temperature signals indicative of sensed temperatures are supplied by way of electrical lines to the processor board 21. The various input thermistors and their locations are as follows:

INPUT THERMISTORS

| THERMISTOR NAME | FUNCTION | LOCATION |
|---|---|---|
| T1 | LEAVING COOLER WATER | LEAVING WATER NOZZLE |
| T2 | ENTERING COOLER WATER | ENTERING WATER BAFFLE SPACE |
| T3 | SATURATED CONDENSING TEMP. CIR. 1 | RETURN BEND OF LAG COIL |
| T4 | SATURATED CONDENSING TEMP. CIR. 2 | RETURN BEND OF LAG COIL |
| T5 | COOLER SATURATED SUCTION TEMP. CIR. 1 | COOLER HEAD NEAR LIQUID NOZZLE |
| T6 | COOLER SATURATED SUCTION TEMP. CIR. 2 | COOLER HEAD NEAR LIQUID NOZZLE |
| T7 | SUPERHEAT GAS ENTERING PISTON CIR. 1 | LEAD COMP. CIR. 1 |
| T8 | SUPERHEATED GAS ENTERING PISTON CIR. 2 | LEAD COMP. CIR. 2 |
| T10 | RESET TEMPERATURE | OUTSIDE AIR OR BUILDING AIR TEMPERATURE |

The processor board 21 uses the temperature readings to control capacity, fan cycling, and the electronic expansion valve.

A relay board 23 receives signals from the processor board 21 and connects output relays to the compressors and unloaders in order to define the loading and unloading sequence of the compressors. The sequences to be used to load and unload the compressors are programmed into the microprocessor on the processor board. Generally, one-half of the relays will be used to control the circuit number 1 compressors and unloader while the other half of the relays are used to control circuit number 2 compressors and unloader. Two basic chiller compressor loading sequences are defined in order to allow for lead-lag control of the compressors. Lead-lag is used to equalize the run time on the compressors. The lead-lag control sequence shall automatically be selected by the software. The sequence is randomly determined after the unit is turned on and is changed whenever the unit becomes fully loaded or fully unloaded.

The display/set point board 22 is generally connected to the processor board 21 through a ribbon cable. Preferably, the board contains a digital display 37, a display switch 38 for energizing the digital display, and a set point potentiometer 39 for adjusting the leaving water temperature set point. Further, the display switch 38 is used in conjunction with the LED display to show the stage of capacity, control system status, and diagnostic information. The diagnostic information is generally displayed on the two digit LED display in numbered codes. Accordingly, the diagnostic information including either operating status information or overload information will automatically be displayed on the LED. The display will rotate every two seconds and overload information will take priority over all other codes. Gen-

REFRIGERATION UNIT CONTROLS

BACKGROUND OF THE INVENTION

This invention relates to refrigeration systems, and more specifically to a method and apparatus for field checking the efficiency and reliability of the electronic control system for an air conditioning unit.

Conventional refrigeration systems utilize a recirculating refrigerant for removing heat from a low temperature side of the refrigeration system and for discharging heat at a high temperature side of the refrigeration system. The work input necessary to operate the refrigeration system is provided by a motor driven compressor which receives low pressure gaseous refrigerant and compresses it to a high pressure. This high pressure gaseous refrigerant is supplied to a condenser where heat is removed from the gaseous refrigerant to condense it to a liquid. This liquid refrigerant is then supplied through an expansion valve to an evaporator wherein heat is transferred from a heat transfer fluid to the liquid refrigerant to evaporate the liquid refrigerant. The heat transfer fluid is thereby cooled and then used to cool a load, such as to cool a building. The evaporated refrigerant from the evaporator is returned to the compressor for recirculation through the refrigeration system. A control system directs the operation of the air conditioning unit.

The electronic control system is designed to replace the electromechanical control systems of air conditioning units. The system consists of several components: the processor board, relay board, set point board, accessory reset board, compressor protection board, control transformer, and thermistors. The processor board contains the microprocessor, power supplies, A/D converters, EXV drivers, relay drivers and display drivers. The control will use a microprocessor with an external eprom memory module or a masked version thereof.

The processor board is a generic board for use with air cooled chillers, water cooled chillers, condenserless chillers, or heat machines. A configuration header is used to program the control at the factory to tell the control what the physical characteristics of the particular unit are. The configuration header uses small wires that are selectively broken to configure the unit to the desired unit. The jumpers act as binary on/off switches and are used to determine the type of unit, the number of compressors, the type of expansion valve used, and the frequency of the power supply system. The jumpers are actually located in a small header that can be removed from the board for setting the configuration. In the past the different unit configurations have been programmed into the control circuit through the control circuit wiring.

Field programmable options can be accomplished by the use of small DIP switch assemblies located on the board. The switches are generally protected by a plastic cover which must be removed before they can be changed in the field. Further, an accessory reset board, having potentiometers thereupon for adjusting leaving water temperature, may be added to increase the efficiency of the unit.

The board also has a series of input thermistors and several switch inputs connected to it. Field adjustments are made through 10K ohm potentiometers. Potentiometers are used to adjust various setpoints.

Various outputs are controlled through relays on a relay board with a display of the outputs located on a display board. The EXV stepper motor, however, is controlled directly by an output from the processor board. To get the different loading sequences from the relays, the logic for controlling the relays has been stored in software and is selected by the unit configuration, compressor, and unloader jumpers. Various relays also control functions of either circuit No. 1 or circuit No. 2 compressors.

A display set point board is connected to the processor board through a ribbon cable and is used to communicate with the operator. Generally, the display set point board is located on the control/gauge panel. The board contains the leaving water set point potentiometer, a two digit display, and a display switch. Through the display, the controls show the stage of capacity, unit operation mode, and diagnostic information.

However, with the added electronic controls it is more difficult for an operator or field repairman to check the operation of the electronics to determine if the unit is operating properly without the use of special external diagnostic tools, which are generally very expensive. The ability to check a control system and have a simple means for checking the operation programming of a very sophisticated electronic control during startup and while running in the field would represent a significant savings in the maintenance of the unit. Thus, there exists a need for a method and apparatus which utilizes installed electronic components to diagnose malfunctions in an air conditioning unit.

SUMMARY OF THE INVENTION

The present invention is directed to a method and apparatus for testing the control system of a refrigeration system.

The various features of novelty which characterize the invention are pointed out with particularity in the claims annexed to and forming a part of this specification. For a better understanding of the invention, its operating advantages and specific objects obtained by its use, reference should be had to the accompanying drawings and descriptive matter in which there is illustrated and described a preferred embodiment of the invention.

BRIEF DESCRIPTION OF THE DRAWINGS

In the accompanying drawings, forming a part of this specification, and in which reference numerals shown in the drawings designating like or corresponding parts throughout the same.

DESCRIPTION OF THE PREFERRED EMBODIMENT

Figure 1:
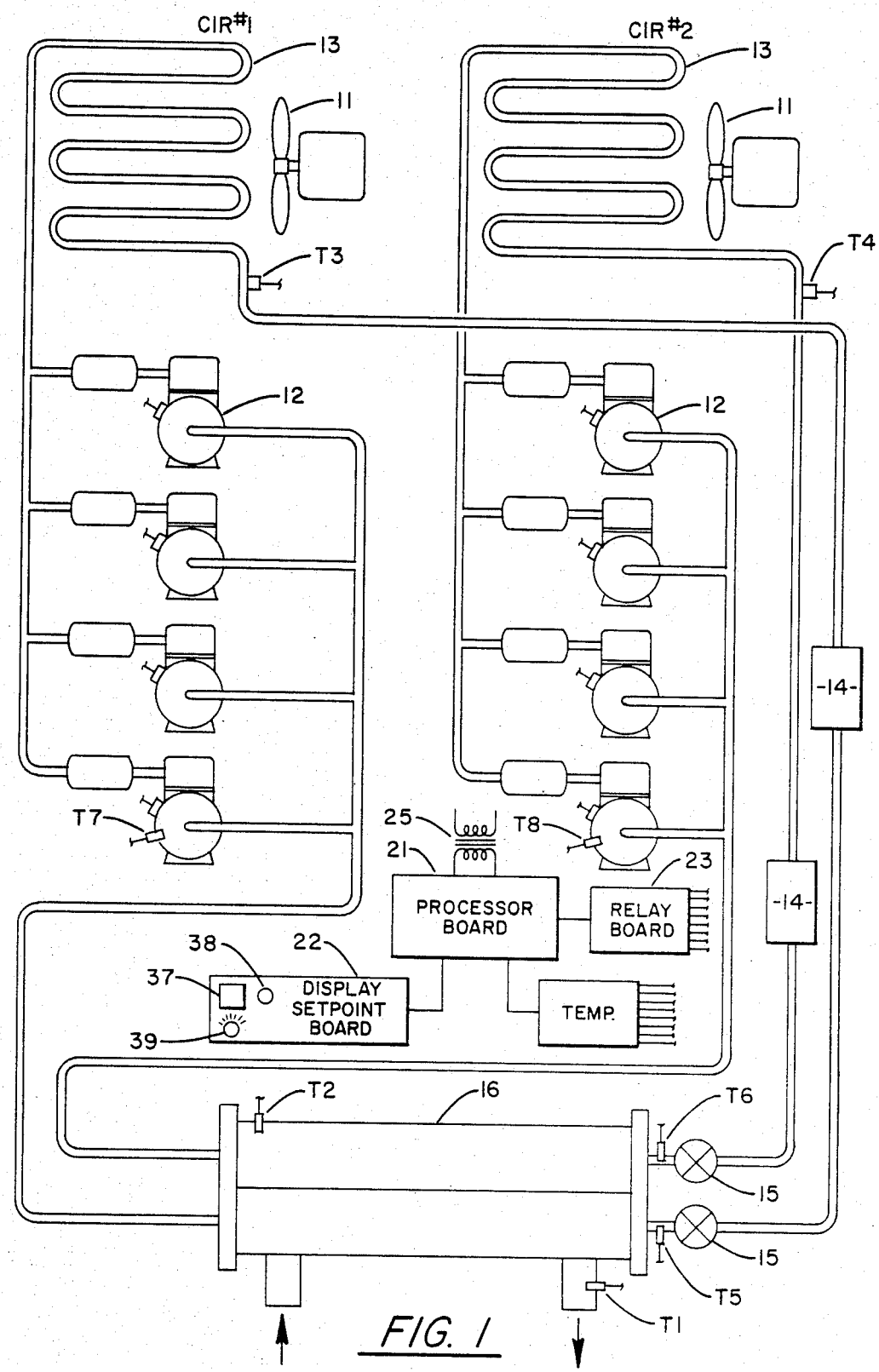
FIG. 1 is a schematic representation of a dual circuit refrigeration system with a control system for operating the refrigeration system.
Figure 2:
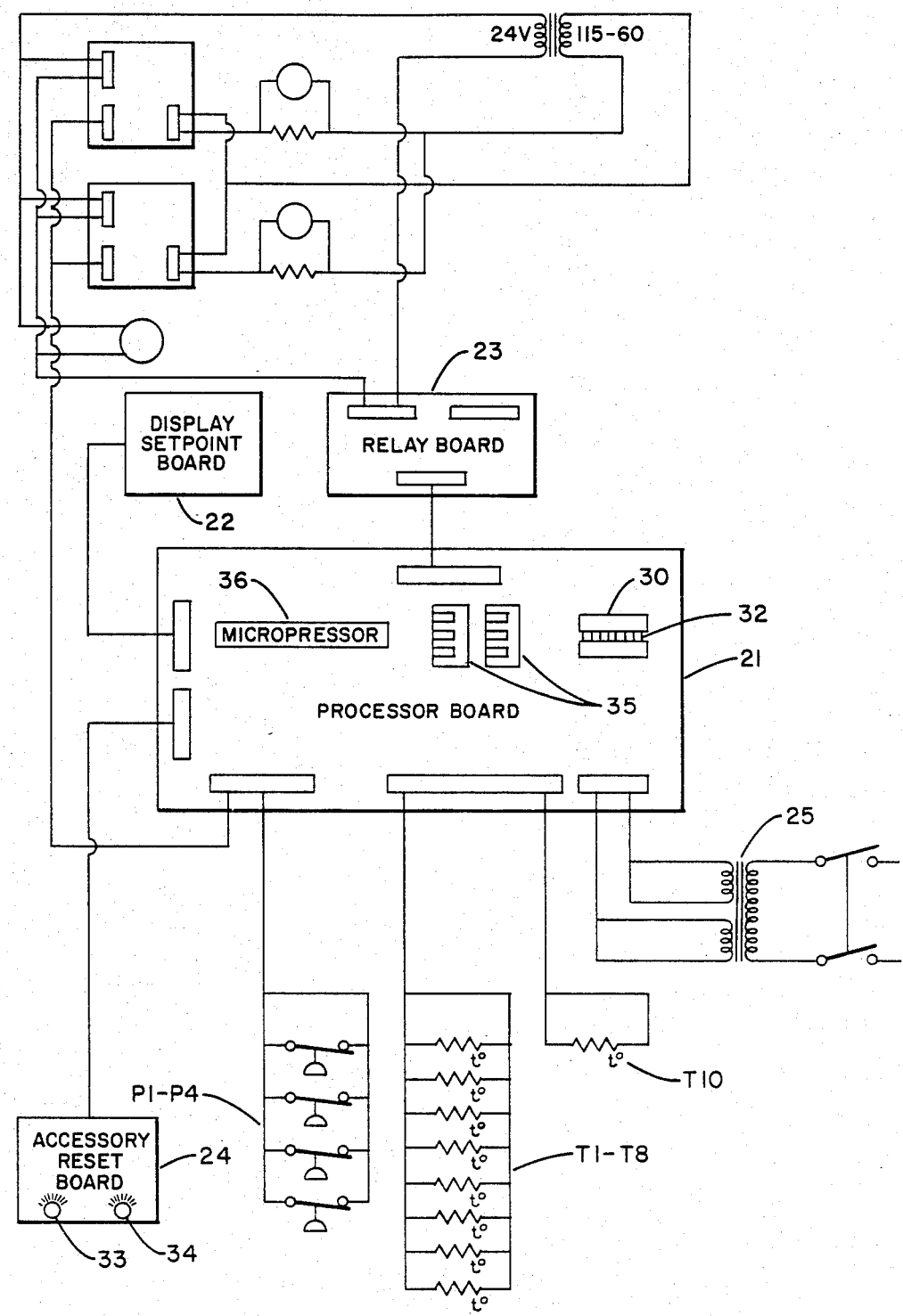
FIG. 2 is a schematic representation of the electronic control circuit of the refrigeration system shown in FIG. 1.

The present invention relates to an electronic control system for a refrigeration system. As shown in FIG. 1, the refrigeration system comprises two circuits each having at least one compressor 12, an air-cooled condenser 13 (cooled by fan 11), a filter-dryer 14, and expansion valve 15, and a dual circuit cooler 16 connected erally, display numbers 0–19 tell the status of the compressor stage numbers, display numbers 20–49 tell operational status information, e.g. relay status for compressors, expansion valves, or economizers, and display numbers 50–99 tell overload information, e.g. compressor failure, thermistor failure, or potentiometer failure. When the processor board 21 receives a signal indicating a malfunction, it loads a failure code into the display 37 and energizes an alarm circuit.

Figure 3:
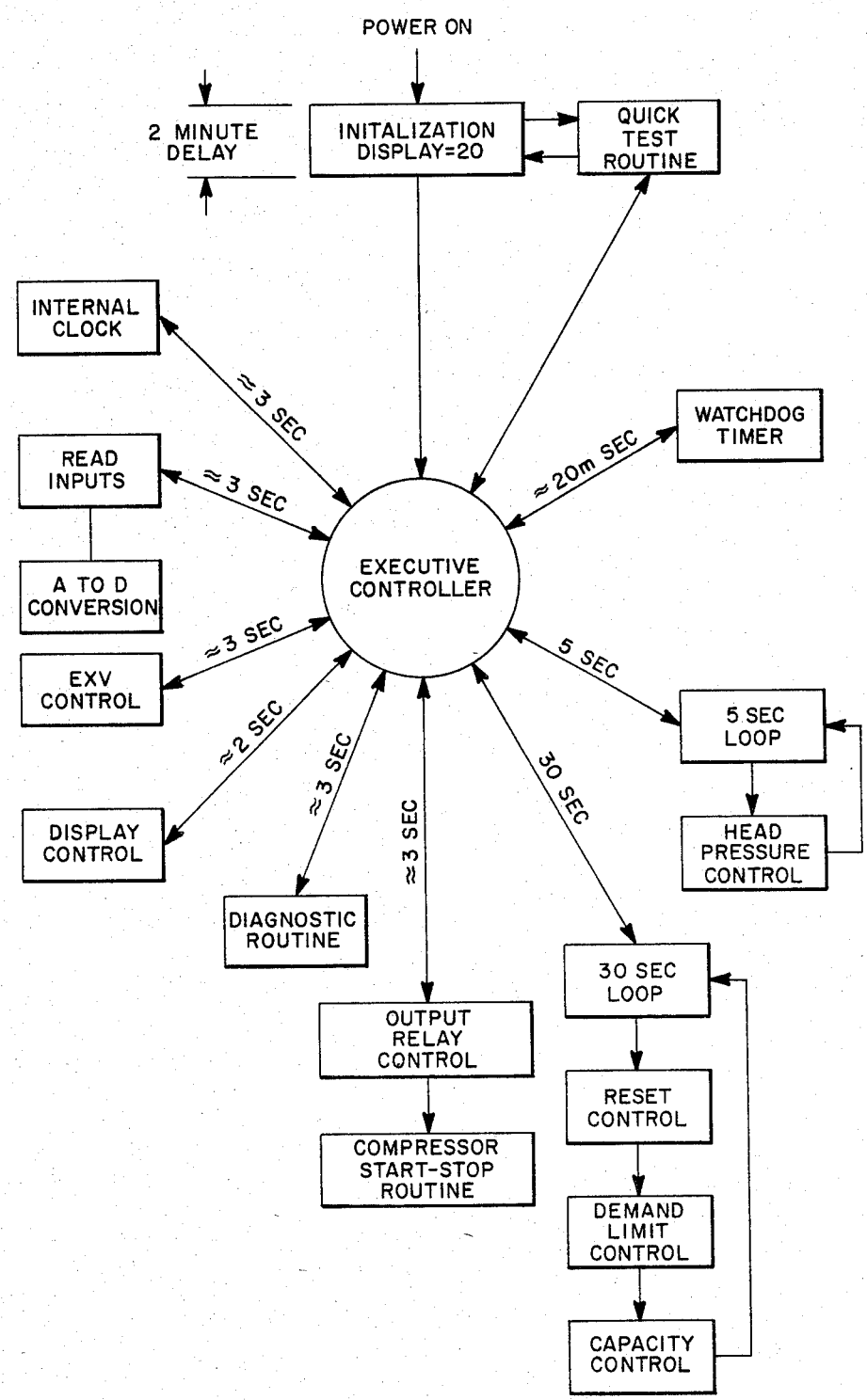
FIG. 3 is a control logic chart illustrating the overall logic used to control the control circuit shown in FIG. 2.

The display/set point board 22 operates as described below and shown in FIG. 3.

The unit is first started by turning the start-stop-reset display switch 38 to start. The switch is also used for resetting the microprocessor, if any safety has been tripped. A reset is accomplished by turning the switch to stop and then to start again. The switch is also used as a circuit breaker for the electronic processor and relay boards.

As soon as the switch is closed, the logic will proceed to the initialization routine. It will stay in this routine for 2 minutes. The display will continuously display "20" during this period. During this time the microprocessor will be initializing the expansion valve's internal constants and will wait for loop temperatures to stabilize. If the display button is pushed during this period, the control will go into the quick test mode.

Once the initial time delay has passed, the logic will proceed to the executive routine where it will begin to control all the various processes. The "20" will be removed from the display and the display will be turned off to increase its life. To view the display, the display button located next to the display must be pushed continuously.

Under normal operation only the stage number will be displayed. If status codes or overload codes are being displayed, then the display will rotate every two seconds and will display up to three numbers. Overload information will take priority over all other codes.

The display board is also used to run a quick test procedure to determine if the control components are connected and operating properly.

The quick test mode procedure is initiated by pressing the display button on the set point board when the number "20" is shown in the display. The number "20" is displayed during the control's initialization stage, which occurs when power is first applied to the processor. When the display button is pushed, the display will change to the number "88" and the alarm light will be lit, this indicates the beginning of the quick test.

The quick test will allow a manual step through a preprogrammed sequence. The display button must be pushed twice for each step of stored sequence. The first push will cause the control to advance to the next step and display the step number followed by a decimal point. When the step number is displayed, no action is taken by the control, when the display button is pushed a second time, the control will initiate the required action. If the display button is pushed again, the control will advance to the next step and stop all actions of the previous step. If it is pushed once more the control will initiate the next step. This procedure must be followed for the 42 or necessary preprogrammed steps. When the last step has been completed, the control will return to the beginning of the quick test and the display will show "88". The control will return to normal operating if the display button is not pushed within 10 minutes or if the operator resets the stop-start switch.

The display will continuously be updated during the test sequence so if a DIP switch or other input device is changed, then the display will show it.

Thus, this test permits checking to make sure every component is connected and operating properly and permits the operator to troubleshoot the refrigeration unit.

What is claimed is:

1. A method of testing the electronic controls of a refrigeration unit from a built in field test panel having a digital display, a digital display control switch, a plurality of condition sensor means, and a test logic circuitry having a preprogrammed procedure comprising the steps of:
   electrically connecting output signals of the plurality of condition sensor means to the inputs of a microprocessor control;
   generating a series of test signals from the preprogrammed procedure of the test logic circuitry of the microprocessor;
   operating the digital display control switch to sequentially advance said series of test signals; and
   displaying the series of test signals on the digital display as the digital display control switch is operated.

2. A method as set forth in claim 1 wherein said series of test signals are displayed as coded numerals on the digital display at the test panel and a series of step numerals are displayed sequentially, one prior to each test signal.

3. A method as set forth in claim 1 wherein said generating, operating and displaying of said series of test signal occurs only during an initialization stage of the electronic controls.

4. A method as set forth in claim 3 wherein said initialization stage occurs generally within two minutes of starting the refrigeration unit.

* * * * *